(12) United States Patent
Robinson et al.

(10) Patent No.: US 7,247,978 B2
(45) Date of Patent: Jul. 24, 2007

(54) ACCELERATION TOLERANT PIEZOELECTRIC RESONATOR

(75) Inventors: Brent J. Robinson, Auckland (NZ); Michael McIlroy, Auckland (NZ); Olexandre A. Boyko, Auckland (NZ); Phil Brownie, Auckland (NZ)

(73) Assignee: Rakon Limited, Mt. Wellington, Aukland (NZ)

( * ) Notice: Subject to any disclaimer, the term of this patent is extended or adjusted under 35 U.S.C. 154(b) by 40 days.

(21) Appl. No.: 11/304,475

(22) Filed: Dec. 14, 2005

(65) Prior Publication Data

US 2006/0125351 A1 Jun. 15, 2006

(30) Foreign Application Priority Data

Dec. 14, 2004 (NZ) .................................... 537285

(51) Int. Cl.
*H01L 41/053* (2006.01)
(52) U.S. Cl. ...................... 310/345; 310/340; 310/348
(58) Field of Classification Search ................ 310/340, 310/341, 345, 346, 348
See application file for complete search history.

(56) References Cited

U.S. PATENT DOCUMENTS

| | | | | |
|---|---|---|---|---|
| 3,675,053 A | * | 7/1972 | Mifune et al. | 310/322 |
| 3,728,562 A | * | 4/1973 | Herson et al. | 310/326 |
| 4,375,041 A | * | 2/1983 | Aizawa et al. | 310/348 |
| 4,779,246 A | * | 10/1988 | Dietzsch et al. | 367/157 |
| 4,914,722 A | * | 4/1990 | Holden et al. | 310/345 |
| 4,965,483 A | * | 10/1990 | Abe et al. | 310/324 |
| 5,250,870 A | | 10/1993 | Fenlon et al. | 310/345 |
| 5,426,401 A | * | 6/1995 | Ogawa et al. | 333/188 |
| 5,442,251 A | | 8/1995 | Kaida et al. | 310/32 |
| 5,818,145 A | * | 10/1998 | Fukiharu | 310/313 R |
| 5,949,294 A | * | 9/1999 | Kondo et al. | 331/68 |
| 6,571,442 B1 | * | 6/2003 | Okeshi et al. | 29/25.35 |
| 6,777,858 B2 | | 8/2004 | Bang et al. | 310/348 |
| 7,135,810 B2 | * | 11/2006 | Okajima | 310/348 |

FOREIGN PATENT DOCUMENTS

JP 2006-108758 * 4/2006

OTHER PUBLICATIONS

Clayton, L. D. et al., "Four-Point SC-Cut Crystal Unit Design Calculations for Reduced Acceleration Sensitivity" *Proceedings of the 1992 IEEE Frequency Control Symposium*, May 27-29, 1992, pp. 582-596.

Zhou, Y. S. et al., "An Analysis of the Normal Acceleration Sensitivity of Contoured Quartz Resonators Stiffened by Identical Top and Bottom Quartz Cover Plates Supported by Clips," *Proceedings of the 1991 IEEE Forty-Fifth Annual Symposium on Frequency Control*, May 29-31, 1991, pp. 298-308.

* cited by examiner

*Primary Examiner*—Thomas M. Dougherty
(74) *Attorney, Agent, or Firm*—Woodcock Washburn LLP

(57) ABSTRACT

The invention relates to piezoelectric resonators. An interposer element is used between a resonating plate and the resonator package to provide improved (i.e. reduced) acceleration sensitivity. The interposer element is preferably of similar thermal expansion characteristics to the resonating plate. Electrical connection to the resonating plate from the exterior of the package is preferably provided via the interposer element.

18 Claims, 6 Drawing Sheets

ACCELERATION TOLERANT PIEZOELECTRIC RESONATOR

CROSS-REFERENCE TO RELATED APPLICATIONS

The present application claims priority to New Zealand Application No. NZ 537285, filed Dec. 14, 2004, which is hereby incorporated by reference in its entirety.

FIELD OF THE INVENTION

The present invention relates to a resonator having a mounting arrangement that improves acceleration sensitivity and resilience to high external accelerations or G-shock.

BACKGROUND OF THE INVENTION

Due to the stability of the resonant frequency of the piezoelectric material, a piezoelectric resonator is commonly used as a frequency source in electronic circuits.

FIGS. 1 and 2 show a typical construction of a resonator comprising a piezoelectric material of appropriate shape, such as a resonator plate 6, fixed by an internal fastening structure 5 to the interior of an enclosure or hermetically sealed package 1. The enclosure may be filled with gas, usually inert gas, or house a vacuum.

One recognized problem in art of resonators relates to a parameter called acceleration sensitivity. For applications that employ the piezoelectric resonator under varying acceleration conditions, the reliability of the piezoelectric resonator as a stable frequency source is jeopardized.

Additional problems are faced when a resonator is exposed to G-shock. Acceleration sensitivity is related to resonant frequency variations resulting from external vibrations, but G-shock is a pulse inertial load in nature due to high external acceleration acting upon for a short time. The effect of G-shock on a resonator is what is known as a "residual frequency shift", which is described in detail below with reference to the "elastic recovery time" definition.

In a worst case G-shock can cause non-operation due to resonator breakage or fastening structure breakage. In some applications, the level of G-shock might induce inertial load high enough to cause elements of the fastening structure to undergo plastic deformations resulting in permanent, "residual frequency shifts" in the piezoelectric resonating plate due to changes in strain/stress conditions. Also, changes in resonating plate position relative to the enclosure will influence static capacitance, which also results in residual frequency shifts.

Some of the terminology used to describe the factors that affect resonator frequency will now be explained.

As used herein the term "electromechanical deformations" relates to a deformation that occurs when an active area of the resonating plate experiences periodic deformations due to the piezoelectric effect induced by an applied periodic electrical field.

As used herein the term "mechanical strength" describes the ability of the fastening structure to hold the resonator plate with minimal displacement of the resonating plate relative to the enclosure. If joints are too flexible, the resonator plate will move as a rigid body inside the enclosure under external accelerations. Ideally, the resonator plate does not move relative to enclosure, i.e. the enclosure and resonator plate inside move as a single body and there are no strain/stresses induced by deformations of internal fastening structure. The acceleration sensitivity of the resonator is then reduced to only variations in electromechanical deformations in a gravitational field (g-sensitivity effect).

As used herein the term "thermal strain" is the result of different thermal deformations of joined parts resulting in changes in shape and dimensions of the joints of the internal fastening structure and of the resonating plate. The enclosure is typically made of isotropic material such as ceramic, glass, steel or the like, or any combination of these materials. The piezoelectric material is always anisotropic. Accordingly, the temperature coefficients of expansion (TCE) of the piezoelectric resonator plate will differ from the TCE of the enclosure in at least one direction, resulting in strain/stress in the fastening structure which in turn is applied to piezoelectric resonator plate.

In the processes of manufacturing and testing and in applications the resonator may be subjected to significant temperature variations. Differences in TCE will result in different dimensional changes (deformations) of the enclosure and resonator plate. These differences are to some degree transferred between the enclosure and resonating plate through the internal fastening structure.

As used herein the term "mechanical strain" describes the stresses/strains due to external mechanical loads, resulting in changes in the shape and dimensions of the resonating plate and consequently in strain/stress of joints of the internal mounting structure. In many applications the resonator must maintain frequency stability under vibrations and/or significant external accelerations (G-shock). To this end, the internal fastening structure is preferably flexible to provide damping in a spectrum of vibrations to reduce mechanical strain induced by externally applied acceleration. The internal fastening structure is preferably strong enough to prevent its breakage under significant inertial loads due to G-shock. It can be seen, therefore, that the design of the internal fastening structure is a trade-off between mechanical strength and the transfer of minimum strain/stresses due to mechanical deformations of resonating plate.

As used herein the term "elastic recovery time" relates to the phenomenon of residual frequency shift, which has been observed after resonators have been tested under vibrations and after G-shock tests. The internal fastening system must include at least two electro-conductive joints connected electrically to external terminals and to two different electrodes plated onto the resonator plate. In other words, the resonator plate must be fastened inside enclosure at least with two joints. Generally two or more joints, spaced apart in some appropriate way, will result in thermal strain in the internal fastening structure if the TCE of the joined parts are different. Mechanical strain in the internal fastening structure is a result of differences in the deformations of joined parts under external loads. After an external load, which may be thermal or mechanical or both, is removed the internal fastening structure tends to relieve internal strain/stresses. The term "elastic recovery time" relates to how fast the elastically-deformed internal fastening structure restores its initial state or establishes a new shape/volume depending on the magnitude of the strain due to the load. The elastic recovery time generally depends on the elastic modulus of the fastening structure as a function of the magnitude of the strain.

Ideally, the elastic recovery time of the internal fastening structure should be equal to the elastic recovery time of both joined parts. If the elastic recovery times are different the joined parts will be strained after external, thermal or mechanical, loads are removed.

An absolutely flexible internal fastening structure would not introduce thermal and mechanical strain issues, but such a structure would not provide any mechanical support for a resonator plate. The internal fastening structure must include at least one elastic joint.

As used herein the term "interposer" relates to a material that is placed as an intermediary between the piezoelectric material and the enclosure.

Current resonator mounting techniques will now be described with reference to prior art resonators shown in FIG. 1 to 4. The arrangement in FIGS. 1 and 2 utilizes two joints as the internal fastening structure. As will be described below, this arrangement has the short side of a strip resonator plate fastened to electrodes inside the enclosure by means of two elastic joints made of electrically conductive glue or another form of suitable conductive adhesive.

The enclosure in this arrangement comprises a ceramic casing 1 with electrodes 4 connected to external terminals, a seal ring 2 and a welded stainless steel lid 3. A resonator plate 6 is fastened to the electrodes 4 by means of conductive flexible adhesive 5. The resonator plate 6 has conductive electrodes 7 on its top and bottom surfaces to excite electromechanical vibrations in the resonator plate by application of an electric field across the plate.

Although this arrangement affords simplicity of assembly, it does make it difficult to limit movement of the resonating plate relative to the enclosure under external acceleration.

In the arrangement of FIG. 3, the prior art resonator uses metal elastic holders as the internal fastening structure. The resonator plate 10 is glued to holders 11 made of thin metal and welded to conductive wire leads passing through the glass filled holes in a base 12. A can 13 then is welded to the base 12 to provide a hermetically sealed enclosure.

This arrangement benefits from reduced thermal deformations and increased mechanical strength. However there are strict requirements in the positioning of the joints relative to the crystallographic axes of the resonating plate. Furthermore, this design is difficult to miniaturize.

FIG. 4 shows a further prior art resonator arrangement. The resonator includes a ceramic casing 21 and a lid 23 as in FIG. 1. One joint 25, which is made of non-elastic strong adhesive, is placed in the middle of one of the short sides of resonating plate 26 and connects the bottom electrode of resonating plate 26 with one of the internal terminals 24. The top electrode of the resonator plate 26 is connected to the opposite internal terminal 24 with a flexible wire joint 27 in the middle of opposite short side of the resonating plate 26.

This design allows for low thermal deformations as both the enclosure and the resonating plate may expand independently. However the design is complex and there may be significant mechanical deformations in the resonator plate under vibrations and external acceleration due to the necessity to use a strong and rigid adhesive, as only one joint can be used resulting in cantilevered mounting of the resonating plate.

There have been other prior art techniques to mount a piezoelectric material within a package. U.S. Pat. No. 6,777,858 to Bang et al. relates to ceramic package for a crystal oscillator. The ceramic package includes a bottom sheet, to which a ceramic buffer sheet is attached, and a crystal wafer that is mounted on the buffer sheet. The buffer sheet serves to support to crystal wafer while protecting the wafer by absorbing external impact applied to the crystal wafer.

U.S. Pat. No. 5,250,870 to Fenlon et al. relates to a crystal package suitable for surface mounting. The piezoelectric device (crystal) is compliantly mounted to a thin package by dollops of adhesive. FIG. 1 of this patent shows the use of four adhesive dollops, while FIG. 2 shows the use of two adhesive dollops to mount the crystal.

A four-point mount for a quartz resonator for improved acceleration sensitivity is described in the 1992 IEEE Frequency Control Symposium paper by Larry D Clayton and Errol P Eernisse, entitled "Four-Point SC-Cut Crystal Unit Design Calculations for Reduced Acceleration Sensitivity". This paper describes the use of an integral mount having four V-clips spaced at equal angular intervals around the circumference of an SC-cut crystal.

A quartz resonator with an internal fastening structure to improve acceleration sensitivity is described in the 1991 IEEE Forty-Fifth Annual Symposium on Frequency Control paper by Y. S. Zhou and H. F Tiersten, entitled "An Analysis of the Normal Acceleration Sensitivity of Contoured Quartz Resonators Stiffened by Identical Top and Bottom Quartz Cover Plates Supported by Clips". This paper describes a biconvex quartz resonator that is sandwiched between identical quartz plates and attached by sidewalls. Despite an improved mechanical strength this prior art does not provide for compensation of residual frequency shifts due to possible changes in the relative position of resonating plate and the quartz plates if plastic deformation of the sidewalls takes place.

It is an object of the present invention to provide an improved resonator that overcomes or alleviates any of the above disadvantages or at least to provide the public with a useful choice.

SUMMARY OF THE INVENTION

In a first aspect of the invention, a resonator comprises an enclosure having an exterior and an interior; an electrically conductive path from the exterior to the interior; an interposer; a plurality of first joints fixing the interposer to the interior of the enclosure; a piezoelectric element; a plurality of second joints fixing the piezoelectric material to the interposer, wherein the piezoelectric element is electrically connected to the electrically conductive path.

Preferably, at least two of the first joints and at least two of the second joints are electrically conductive, and the piezoelectric element is connected to the electrically conductive path via the first and second joints.

Preferably, the first electrically conductive joints affixing the interposer to the enclosure are non-elastic. Preferably, the electrically conductive joints affixing the interposer to the enclosure are conductive epoxy adhesive joints, or gold bump bonding joints.

Preferably, the electrically conductive path is connected to a pair of electrodes located in the interior of the enclosure. The electrodes are preferably deposits of conductive material on a portion of a surface of the interior. Preferably, the interposer is affixed to the electrodes by the at least two electrically conductive joints.

Preferably, the interposer is provided with a conductive path on at least one surface, on which the electrically conductive joints are located. The conductive paths are preferably formed by deposition of conductive material.

Preferably, the interposer is provided with additional deposited conductive patches, in order to modify the internal static capacitance of the resonator.

Preferably, the interposer is a strip-form interposing plate. The interposing plate is preferably affixed to the enclosure by two electrically conductive joints located substantially symmetrically about the centre of the interposing plate.

Preferably the piezoelectric element is affixed to the interposer by three or more electrically conductive joints.

The piezoelectric element is preferably a strip form resonating plate. The resonating plate is preferably affixed to the interposer by four electrically conductive joints located about at each corner of the plate.

Preferably, the interposer and the piezoelectric element have substantially the same thermal expansion characteristics. Preferably, the interposer is formed from the same material as the piezoelectric element but may be of a different material. Preferably, the piezoelectric element is formed from quartz crystal.

In a second aspect of the invention, a resonator comprises: an enclosure having an exterior and an interior; an electrically conductive path from the exterior to the interior; an interposer, a plurality of first joints fixing the interposer to the interior of the enclosure, at least two of the first joints being electrically conductive; a piezoelectric element; a plurality of second joints fixing the piezoelectric material to the interposer, at least two of the second joints being electrically conductive; wherein the interposer and piezoelectric element are electrically connected, via the first and second joints, to the electrically conductive path.

In a third aspect of the invention, a resonator comprises an enclosure having an exterior and an interior; an electrically conductive path from the exterior to the interior; an interposer fixed to the interior of the enclosure; a piezoelectric element fixed to the interposer; wherein the piezoelectric element is electrically connected to the electrically conductive path; and wherein the interposer and the piezoelectric element have substantially the same thermal expansion characteristics.

BRIEF DESCRIPTION OF THE DRAWINGS

Preferred forms of the invention will now be described with reference to the accompanying figures, in which.

DETAILED DESCRIPTION OF ILLUSTRATIVE EMBODIMENTS

The resonator of the invention is arranged to minimize the effects of acceleration and g-forces on the resonator. This is achieved using an interposer mount. A further and/or optional feature is for the interposer to have thermal characteristics same or similar to the piezoelectric element.

Figure 1:
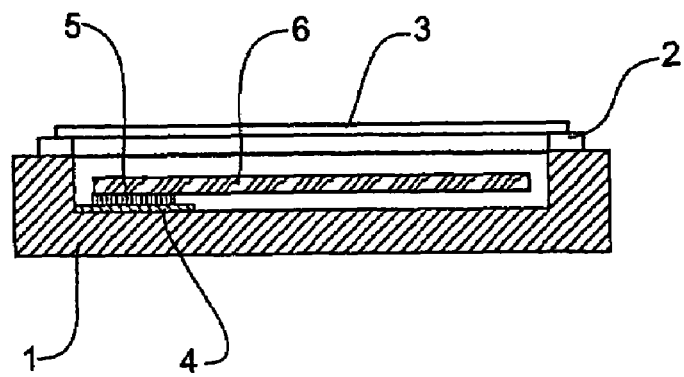
FIG. 1 is a cross-section view of a prior art resonator with a two-joint internal fastening structure.
Figure 2:
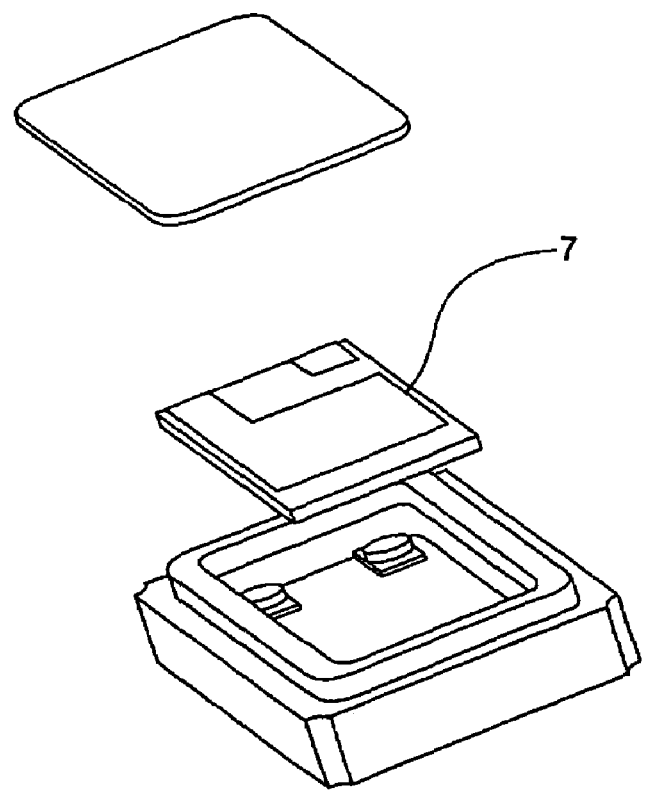
FIG. 2 is a three-dimensional exploded view of the prior art resonator of FIG. 1.
Figure 3:
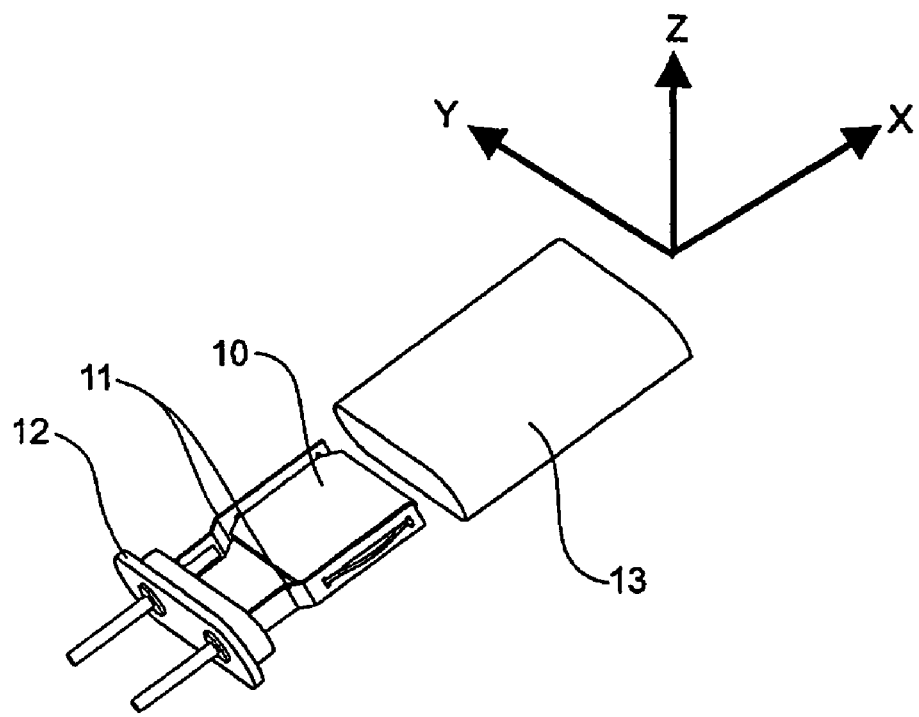
FIG. 3 is a three-dimensional exploded view of a can-type prior art resonator.
Figure 4:
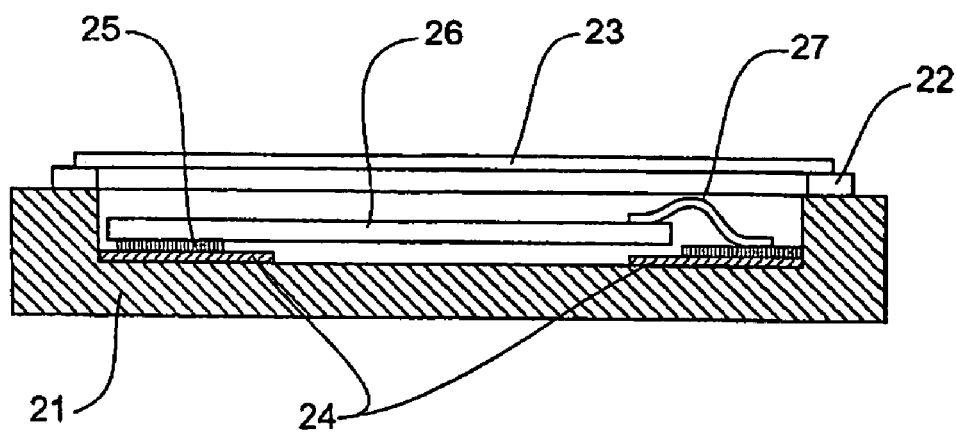
FIG. 4 is a cross-section view of a prior art resonator having a flexible wire joint.
Figure 5:
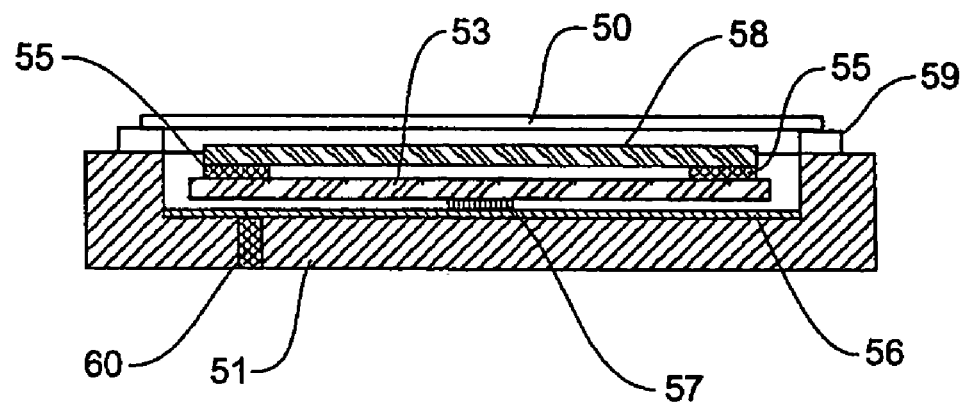
FIG. 5 is a cross-section view of the preferred form resonator.
Figure 6:
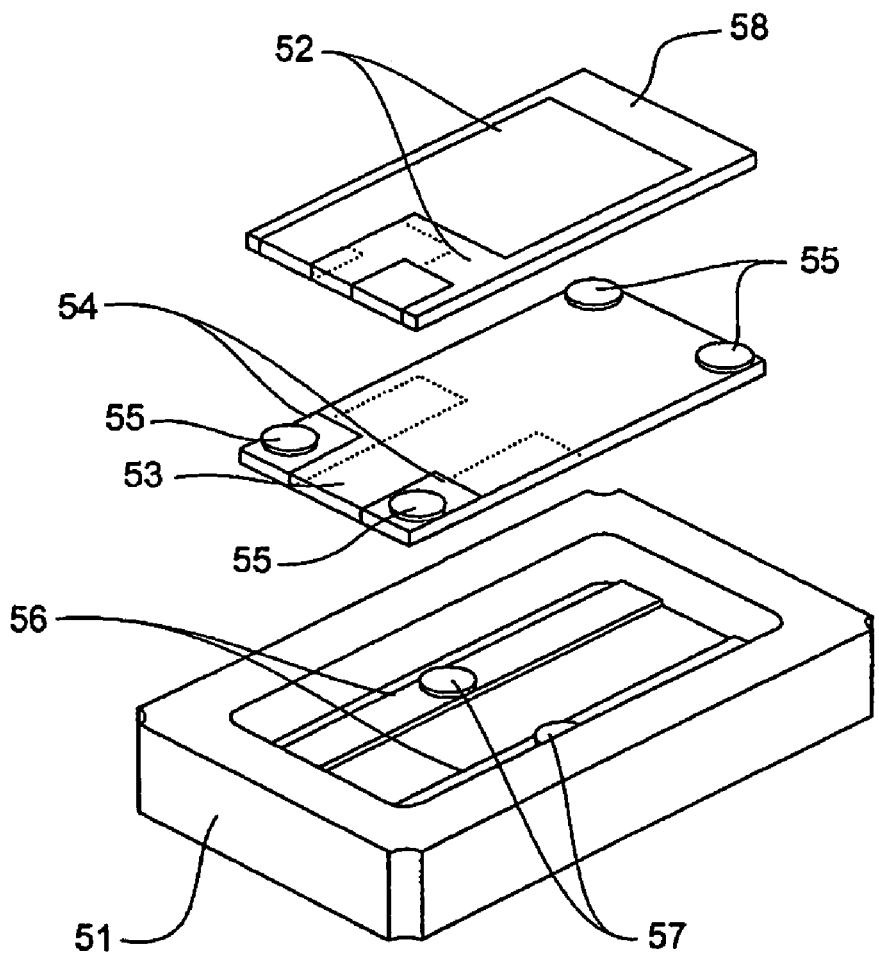
FIG. 6 is a three-dimensional exploded view of the resonator of FIG. 5.

Referring to FIGS. 5 and 6 one preferred embodiment of the resonator is shown. The resonator comprises an enclosure consisting of a casing 51 and a lid 50. The casing material is preferably laminated ceramic, but may be any other suitable material such as glass, steel or the like or any combination of these materials.

The casing 51 is sealed in a suitable way according to the application of the resonator. Persons skilled in the art will be aware of sealing methods such as soldering, seam welding, cold welding, and resistance welding using current pulses. Seam welding may be employed for ceramic casing having a kovar ring and cold welding may be employed for stainless steel can casings. The sealing may alternatively or additional be achieved using adhesive. As shown, a seal ring 59 is provided between the lid 50 and the casing 51 to ensure the enclosure is hermetically sealed.

The resonator is connected to an external circuit through electrical terminals provided on the casing 51 (not shown) via an electrical path 60. The external electrical terminals are connected to interior electrodes 56, provided in the interior of the casing 51. The interior electrodes 56 are preferably formed by depositing electrically conductive material such as metal on an interior surface of the casing 51.

Figure 7:
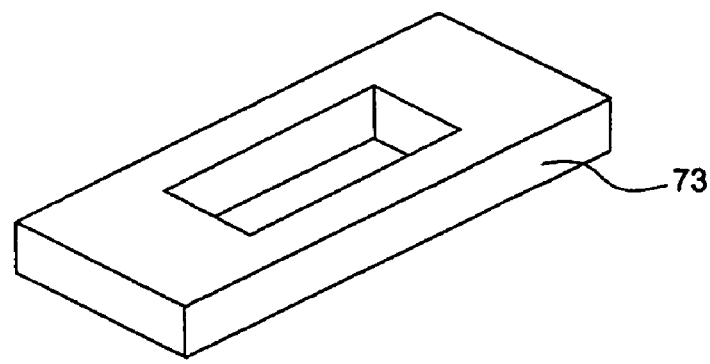
FIG. 7 is an example shape of the resonating plate and/or interposer.

An interposer 53 is affixed to the casing 51 on at least two electrically conductive joints, shown as lower joints 57, which form the lower fastening structure of the resonator. The interposer in the figure is shown as an interposing plate made of AT-cut quartz, the same material as a resonating plate, although other forms of interposer may be used instead. For instance in terms of its profile or thickness, the interposer may be rectangular, beveled or a combination of rectangular and convex profiles. In terms of its planar configuration, the interposer may be essentially rectangular or circular, either contiguous or with openings/holes. In terms of AT-cut angle it may be different from resonating plate. An example form interposer 73 with a central hole is shown in FIG. 7.

The lower joints 57 may be formed of elastic or strong non-elastic material, such as an electrically conductive epoxy glue or "gold bump" bonding joint, to provide for sufficient mechanical strength to hold the whole construction within an enclosure. In the preferred form the lower joints 57 are located at about the centre of the interior electrodes 56. Conductive paths (shown in dotted lines) are provided on the underside of the interposing plate 53 to contact the lower joints 57 when the interposing plate 53 is joined to the casing 51. The conductive path may continue to the opposite surface of the interposing plate 53 as shown by the reference numeral 54 in FIG. 6. This facilitates connectivity of the interposing plate 53 with the piezoelectric material as will be described in detail later.

Once the interposing plate 53 is affixed to the casing 51, the electrical connection from the external terminals of the casing 51 is made available to the conductive path 54 through the electrodes 56, lower joints 57 and the underside conductive paths on the interposing plate 53.

The interposing plate 53 thickness and shape may be altered in accordance with the shape/material of the casing 51 and/or the shape/material of the piezoelectric element 58. The thickness and shape of interposer in combination with upper and lower glue joints structures influences the transfer of vibrations from casing to a resonator plate. Persons skilled in the art will readily appreciate the many ways in which the parameters can be altered depending on the proposed application of the resonator. Interposing plate 53 should be dimensioned to facilitate required mounting of resonator as per example shown on FIGS. 5, 6, 8-10.

The piezoelectric material in the resonator is shown as resonating plate 58. As with the interposer, the piezoelectric material shape may be altered. In terms of its profile or thickness, the piezoelectric material may be rectangular, beveled or a combination of rectangular and convex profiles. More complex profiles such as a biconvex profile may also be used. In terms of its planar configuration, the piezoelectric material may be essentially rectangular or circular, either contiguous or with openings/holes.

In an example form the resonating plate may be an AT-cut quartz crystal plate. The resonating plate 58 is affixed to the interposing plate 53 using a plurality of joints, upper joins 55, made of silicone silver filled glue, which provide at least two electrically conductive joints. The plurality of upper joints 55 make up the upper fastening structure of the resonator.

As shown in FIG. 6, two upper joints 55 are provided on the conductive path 54, while two more upper joints 55 are provided without electrical connection to the conductive path. By employing four upper joints, the fastening structure is afforded greater mechanical strength as will be described in detail below.

To impart electrical energy to the resonating plate 58, plate electrodes 52 are provided on the resonating plate 58. The plate electrodes 52 may be formed by depositing conductive material such as metal onto the surface of the resonating plate 58, using evaporation. The design of the electrodes 52 may take many forms, but must be in contact with the at least two conducting upper joints 55 once the resonating plate 58 is affixed to the interposing plate 53.

Once the resonator shown in exploded view in FIG. 6 is fully assembled, the resonator allows for electrical connection from the external terminals of the casing 51 to the plate electrodes 52 of the resonating plate 58. From the external terminals, a conductive electrical connection is provided through the interior electrodes 56, through the at least two conductive lower joints 57, then through the conductive path 54 and the at least two conductive upper joints 55, to the plate electrodes 52.

Figure 8:
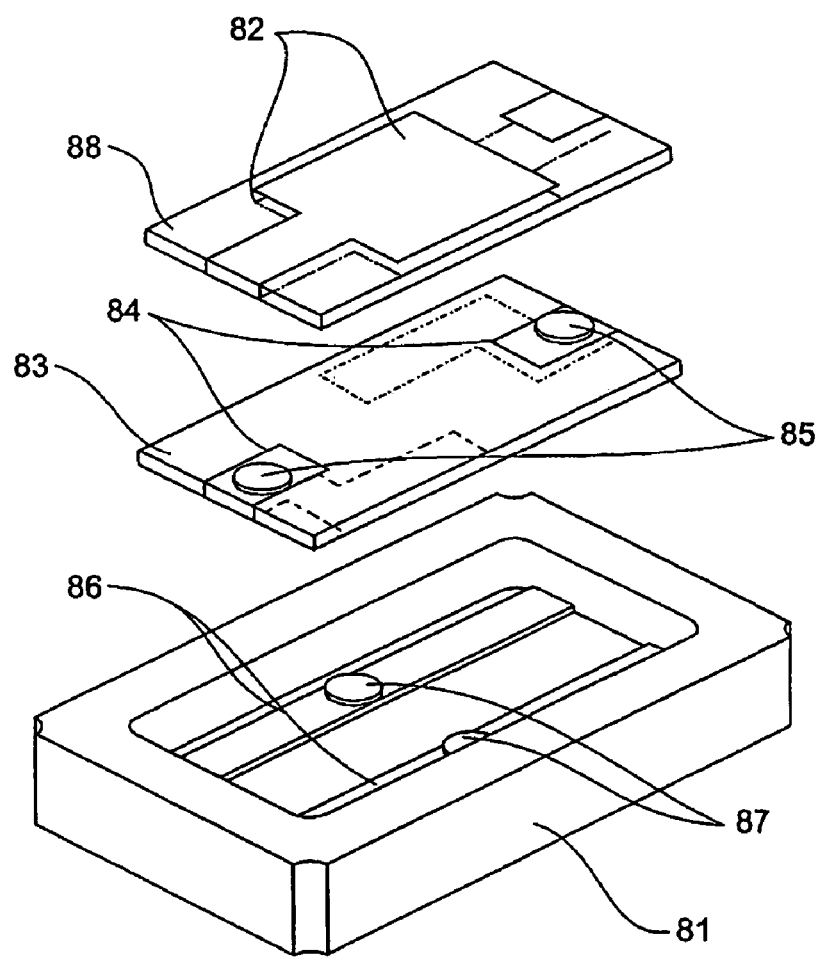
FIG. 8 is a three-dimensional exploded view of a further resonator form.

An alternative arrangement of the upper joints and the upper fastening structure is shown in FIG. 8. A casing 81 and interior electrodes 86 are provided as in the embodiment of FIGS. 5 and 6. An electrode structure 82 is similarly provided on the resonating plate 88. In this arrangement only two upper joints 85 are provided, both of which are electrically conductive. For this reason, both upper joints 85 are located on conductive paths 84. Mechanical strength in the preferred form arrangement comes from replacing the prior art cantilever mounting of resonating plate with a symmetrical structure. Although the upper joints 85 have been relocated, the lower joints 87 remain in the same location. To ensure electrical connectivity in this case, the conductive path provided on the underside of the interposing plate 83, which is shown in dotted lines, has been altered so that each upper joint 85 is electrically connected to one lower joint 87.

In addition to the changes of the underside conductive path, the plate electrodes 82 on the resonating plate 88 has also been changed. The new layout of the plate electrodes 82 ensure that the resonating plate 88 is in electrical communication with the upper joints 85.

Clearly there will be a number of ways in which the location/layout of the joints, electrodes and/or conductive paths may be provided. These are readily ascertainable by a skilled person in view of the two examples provided in FIGS. 6 and 8.

Figure 11:
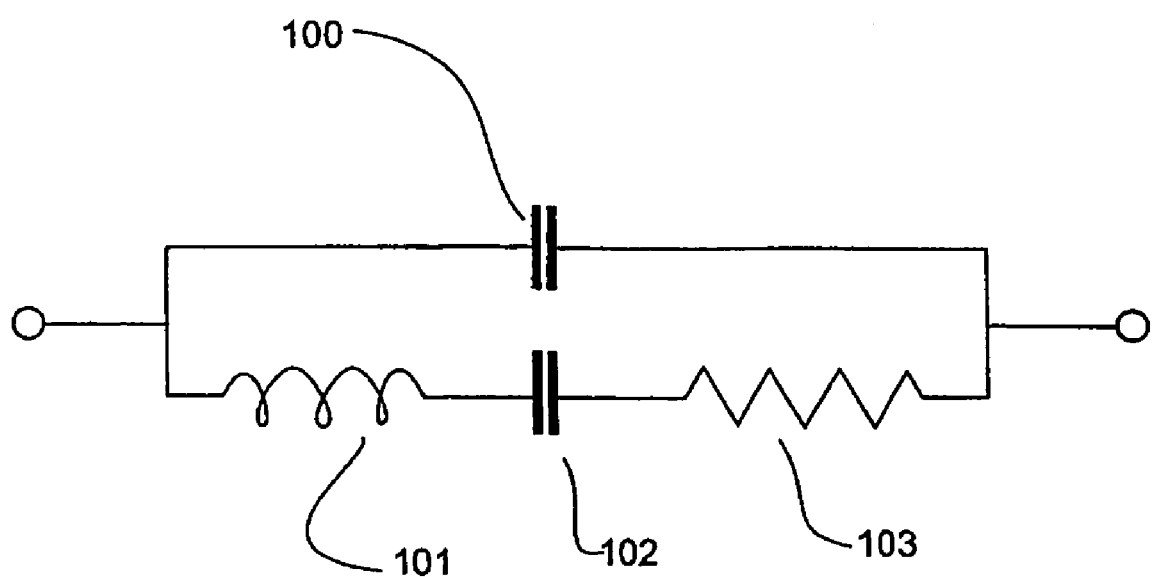
FIG. 11 is an equivalent circuit for piezoelectric resonator.

FIG. 11 illustrate the equivalent circuit for a resonator in accordance with the present invention. The equivalent circuit includes a static capacitance element 100 in parallel with an inductor 101, a capacitor 102 and a resistor 103. Clearly, the static capacitance value affects the resonant frequency of the resonator. The value of the static capacitance is affected by the position and size of the conductive surfaces within the resonator relative to conductive surfaces within interposer and enclosure. For this reason the shape of the electrodes in the resonator, in the interposer and their spacing is important. Particular designs for the electrodes on the interior of the casing and on the interposer may be beneficial. Indeed, some arrangements of electrodes may compensate for, or at least minimize, residual frequency shifts arising from permanent plastic deformations in fastening structure due to external loads. Conductive surfaces within the interposer may be of any suitable shape, may be electrically isolated from conductive path to resonator electrodes and present for no other reason than to affect static capacitance. Resonators of different dimensions and material properties will benefit from different layouts of conductive surfaces.

Figure 9:
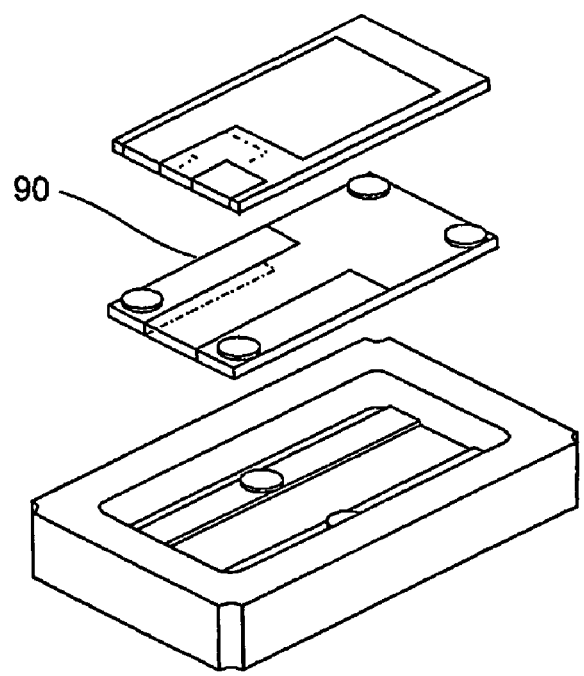
FIG. 9 is a three-dimensional exploded view of a further resonator form.
Figure 10:
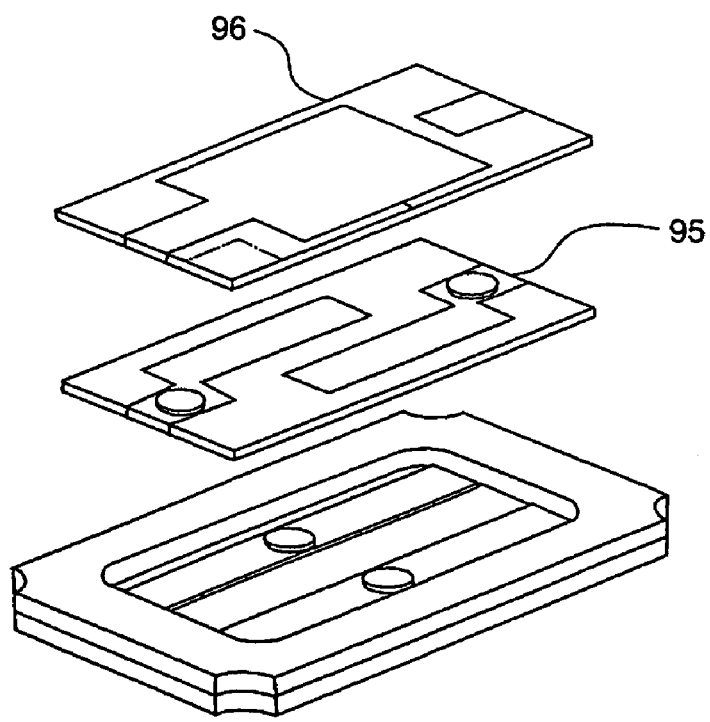
FIG. 10 is a three-dimensional exploded view of a further resonator form.

FIGS. 9 and 10 show embodiments of resonators in accordance with the present invention, having different conductive surfaces within the interior of the casing. In particular, FIG. 9 shows a resonator with a different electrode structure 90 on the interposer to that shown in FIG. 6. FIG. 10 shows a resonator that differs from the embodiment shown in FIG. 6 in the electrode structure on both the interposer 95 and the piezoelectric element 96. In all other respects the resonators of FIGS. 9 and 10 are identical to that described with reference to FIGS. 5 and 6.

In a preferred embodiment, the interposing plate may be made of the same or similar piezoelectric material as resonating plate. As such both resonating plate and interposing plate two will share the same or similar TCE. This embodiment allows for the compensation of differences in thermal properties between the resonating plate and the casing, the disadvantage of which was described earlier in the definition of thermal strain.

The interposing plate 53 in this form will provide a lesser thermal strain in the upper joints 55 in the upper fastening structure. This is a result of smaller differences in thermal expansions of the resonating plate 58 and the matching interposing plate 53. By reducing the thermal expansion effects, the resonating plate 58 can be affixed to the interposing plate 52 using more than two joints without risking the side effects of increased thermal strain. As shown in FIG. 6, four upper joints 55 are employed to increase the mechanical strength between the resonating plate 58 and the interposing plate 53.

As a result of the higher mechanical strength, inertial load imposed by the resonating plate 58 under external acceleration conditions results in lesser amounts of strain in the upper joints 55. This consequently reduces the elastic recovery time of the upper fastening structure, which in turn reduces the residual frequency shifts once the external acceleration ceases.

Based on the above described arrangements, the resonating plate 58 may be effectively decoupled both mechanically and/or thermally from casing 51 by means of the lower fastening structure and/or the interposing plate 53.

In the particular arrangement of the interposer having preferred thermal characteristics, the elastic properties of lower joints 57 in the lower fastening structure influence the strain/stresses on the resonating plate 58 in a lesser degree than conventional resonator designs. The preferred double-plate structure (a combination of the interposing plate and resonating plate) of the resonator provides for less mechanical deformations of the resonating plate under external mechanical loads that arise from accelerations and/or thermal deformations due to differences in the TCE of the joined parts.

A further preferred form double-plate resonator may also comprise vibration attenuation means, which is coupled to both the vibration source (that is casing 51) and to resonating plate 58. Such a vibration attenuation means is known in prior art such as in U.S. Pat. No. 5,442,251, which describes a vibration transfer plate that is coupled dynamically to a source of vibrations. In contrast to this prior art, the preferred embodiment of the vibration attenuation means for this invention employs shear mode vibrations of upper joints 55 in the upper fastening structure as well as bending or rotational vibrations of the interposing plate 53.

Resonators including an interposer between the piezoelectric element and the packaging in accordance with the present invention have shown significant reductions in acceleration sensitivity

What is claimed:

1. A resonator comprising:
   an enclosure having an exterior and an interior;
   an electrically conductive path from the exterior to the interior;
   an interposer;
   a plurality of first joints fixing the interposer to the interior of the enclosure;
   a piezoelectric element; and
   a plurality of second joints fixing the piezoelectric material to the interposer,
   wherein the piezoelectric element is electrically connected to the electrically conductive path.

2. A resonator according to claim 1 wherein at least two of the first joints and at least two of the second joints are electrically conductive, and the piezoelectric element is connected to the electrically conductive path via the first and second joints.

3. A resonator according to claim 2 wherein the first electrically conductive joints affixing the interposer to the enclosure are non-elastic.

4. A resonator according to claim 2 wherein the electrically conductive joints affixing the interposer to the enclosure are conductive epoxy adhesive joints, or gold bump bonding joints.

5. A resonator according to claim 1 wherein the electrically conductive path is connected to a pair of electrodes located in the interior of the enclosure.

6. A resonator according to claim 5 wherein the electrodes are deposits of conductive material on a portion of a surface of the interior.

7. A resonator according to claim 5 wherein the interposer is affixed to the electrodes by the at least two electrically conductive joints.

8. A resonator according to claim 1, wherein the interposer is provided with a conductive path on at least one surface, on which the first electrically conductive joints are located.

9. A resonator according to claim 8, wherein the interposer is provided with additional conductive elements, in order to modify the internal static capacitance of the resonator.

10. A resonator according to claim 1, wherein the interposer is a strip-form interposing plate.

11. A resonator according to claim 10, wherein the interposing plate is fixed to the enclosure by two electrically conductive joints located substantially symmetrically about the centre of the interposing plate.

12. A resonator according to claim 1, wherein the piezoelectric element is affixed to the interposer by two or more electrically conductive joints.

13. A resonator according to claim 1 wherein the piezoelectric element is a strip form resonating plate.

14. A resonator according to claim 13, wherein the resonating plate is fixed to the interposer by four electrically conductive joints located about at each corner of the plate.

15. A resonator according to claim 1, wherein the interposer and the piezoelectric element have substantially the same thermal expansion characteristics.

16. A resonator according to claim 1, wherein the interposer is formed from the same material as the piezoelectric element.

17. A resonator comprising:
    an enclosure having an exterior and an interior;
    an electrically conductive path from the exterior to the interior;
    an interposer;
    a plurality of first joints fixing the interposer to the interior of the enclosure, at least two of the first joints being electrically conductive;
    a piezoelectric element; and
    a plurality of second joints fixing the piezoelectric material to the interposer, at least two of the second joints being electrically conductive;
    wherein the interposer and the piezoelectric element are electrically connected via the first and second joints to the electrically conductive path.

18. A resonator comprising:
    an enclosure having an exterior and an interior;
    an electrically conductive path from the exterior to the interior;
    an interposer fixed to the interior of the enclosure; a piezoelectric element fixed to the interposer;
    wherein the piezoelectric element is electrically connected to the electrically conductive path; and
    wherein the interposer and the piezoelectric element have substantially the same thermal expansion characteristics.

* * * * *

UNITED STATES PATENT AND TRADEMARK OFFICE
CERTIFICATE OF CORRECTION

| | |
|---|---|
| PATENT NO. | : 7,247,978 B2 |
| APPLICATION NO. | : 11/304475 |
| DATED | : July 24, 2007 |
| INVENTOR(S) | : Brent J. Robinson et al. |

It is certified that error appears in the above-identified patent and that said Letters Patent is hereby corrected as shown below:

Title Page, Column 1, Item [75], delete "Brownie" and insert --Brownlie-- therefore.

Signed and Sealed this

Twenty-ninth Day of July, 2008

JON W. DUDAS
*Director of the United States Patent and Trademark Office*